United States Patent
den Boer

(10) Patent No.: US 7,023,503 B2
(45) Date of Patent: Apr. 4, 2006

(54) IMAGE SENSOR WITH PHOTOSENSITIVE THIN FILM TRANSISTORS

(75) Inventor: Willem den Boer, Hillsboro, OR (US)

(73) Assignee: Planar Systems, Inc., Beaverton, OR (US)

( * ) Notice: Subject to any disclaimer, the term of this patent is extended or adjusted under 35 U.S.C. 154(b) by 107 days.

(21) Appl. No.: 10/347,149

(22) Filed: Jan. 17, 2003

(65) Prior Publication Data

US 2003/0218116 A1      Nov. 27, 2003

Related U.S. Application Data

(63) Continuation-in-part of application No. 10/217,798, filed on Aug. 12, 2002, which is a continuation-in-part of application No. 10/307,106, filed on Nov. 27, 2002.

(60) Provisional application No. 60/359,263, filed on Feb. 20, 2002.

(51) Int. Cl.
*G02F 1/136* (2006.01)
*H01L 27/00* (2006.01)
*H01L 29/04* (2006.01)
*G09G 3/20* (2006.01)

(52) U.S. Cl. .................. 349/48; 349/42; 250/208.1; 257/59; 345/55

(58) Field of Classification Search .......... 250/208.1, 250/370.02, 370.08; 438/160, 166, 36, 589; 257/443, 445, 428, 440, 59; 349/41–43, 349/48

See application file for complete search history.

(56) References Cited

U.S. PATENT DOCUMENTS

| 4,220,815 | A |   | 9/1980 | Gibson et al. ............... 178/18 |
| 4,320,292 | A |   | 3/1982 | Oikawa et al. ............ 250/221 |
| 4,345,248 | A | * | 8/1982 | Togashi et al. ............... 345/90 |
| 4,476,463 | A |   | 10/1984 | Ng et al. .................... 345/174 |
| 4,481,510 | A |   | 11/1984 | Hareng et al. .............. 345/100 |

(Continued)

FOREIGN PATENT DOCUMENTS

DE            3602796 A1      8/1987

(Continued)

OTHER PUBLICATIONS

Muncaki Yamguchi et al., "Two-dimensional Contact-Type Image Sensor Using Amorphous Silicon Photo-Transistor", Jpn. J. Appl. Phys. vol. 32, pp. 458-461, Jan. 1993.

Jeong Hyun Kim et al., "Fingerprint Scanner Using a-Si: H TFT-array", SID '00 Digest, May 14, 2000.

*Primary Examiner*—Tarifur R. Chowdhury
(74) *Attorney, Agent, or Firm*—John R. Thompson; Stoel Rives LLP

(57) ABSTRACT

An image sensor array includes image sensors having photo TFTs to generate photocurrent in response to received images. The photo TFTs each have their respective gate electrodes shorted to source electrodes to increase generated photocurrent. Storage capacitors are coupled to each photo TFT and discharged upon generation of a photocurrent. Each storage capacitor is coupled to a readout TFT that passes a current from the storage capacitor to a data line. Data lines indicate location of the received image on the image sensor array.

22 Claims, 7 Drawing Sheets

U.S. PATENT DOCUMENTS

| | | | | |
|---|---|---|---|---|
| 4,496,981 A * | 1/1985 | Ota | | 348/294 |
| 4,603,356 A | 7/1986 | Bates | | 348/367 |
| 4,644,338 A | 2/1987 | Aoki et al. | | 345/92 |
| 4,655,552 A * | 4/1987 | Togashi et al. | | 349/24 |
| 4,662,718 A | 5/1987 | Masubuchi | | 345/99 |
| 4,679,909 A | 7/1987 | Hamada et al. | | 349/42 |
| 4,684,939 A | 8/1987 | Streit | | 345/102 |
| 4,698,460 A | 10/1987 | Krein et al. | | 345/173 |
| 4,720,869 A | 1/1988 | Wadia | | 382/115 |
| 4,740,782 A | 4/1988 | Aoki et al. | | 345/925 |
| 4,759,610 A * | 7/1988 | Yanagisawa | | 349/162 |
| 4,767,192 A | 8/1988 | Chang et al. | | 349/24 |
| 4,772,101 A | 9/1988 | Liu | | 349/17 |
| 4,782,327 A | 11/1988 | Kley et al. | | 341/2 |
| 4,782,328 A | 11/1988 | Denlinger | | 341/5 |
| 4,785,564 A | 11/1988 | Gurtler | | 345/104 |
| 4,794,634 A | 12/1988 | Torihata et al. | | 379/93.1 |
| 4,814,760 A | 3/1989 | Johnston et al. | | 345/104 |
| 4,823,178 A * | 4/1989 | Suda | | 257/444 |
| 4,917,474 A | 4/1990 | Yamazaki et al. | | 345/104 |
| 5,003,356 A | 3/1991 | Wakai et al. | | |
| 5,051,570 A | 9/1991 | Tsujikawa et al. | | 250/229 |
| 5,105,186 A | 4/1992 | May | | 345/175 |
| 5,140,153 A | 8/1992 | Heikkinen et al. | | 250/221 |
| 5,151,688 A * | 9/1992 | Tanaka et al. | | 345/104 |
| 5,153,420 A * | 10/1992 | Hack et al. | | 250/208.1 |
| 5,172,104 A | 12/1992 | Tanigaki et al. | | |
| 5,204,661 A * | 4/1993 | Hack et al. | | 345/88 |
| 5,236,850 A | 8/1993 | Zhang | | 335/219 |
| 5,243,332 A | 9/1993 | Jacobson | | 438/166 |
| 5,339,090 A | 8/1994 | Crossland et al. | | 345/90 |
| 5,339,091 A | 8/1994 | Yamazaki et al. | | 345/104 |
| 5,349,174 A | 9/1994 | Van Berkel et al. | | |
| 5,381,251 A * | 1/1995 | Nonomura et al. | | 349/24 |
| 5,386,543 A * | 1/1995 | Bird | | 358/1.1 |
| 5,414,283 A | 5/1995 | den Boer et al. | | |
| 5,445,871 A | 8/1995 | Murase et al. | | 428/215 |
| 5,461,400 A | 10/1995 | Ishii et al. | | 345/182 |
| 5,475,398 A | 12/1995 | Yamazaki et al. | | 345/104 |
| 5,483,263 A * | 1/1996 | Bird et al. | | 345/207 |
| 5,485,177 A | 1/1996 | Shannon et al. | | 345/182 |
| 5,525,813 A | 6/1996 | Miyake et al. | | |
| 5,532,743 A | 7/1996 | Komobuchi | | 348/297 |
| 5,568,292 A * | 10/1996 | Kim | | 349/110 |
| 5,581,378 A | 12/1996 | Kulick et al. | | 359/9 |
| 5,585,817 A | 12/1996 | Itoh et al. | | 345/104 |
| 5,589,961 A * | 12/1996 | Shigeta et al. | | 349/41 |
| 5,598,004 A | 1/1997 | Powell et al. | | |
| 5,610,629 A * | 3/1997 | Baur | | 345/104 |
| 5,635,982 A | 6/1997 | Zhang et al. | | 348/231 |
| 5,637,187 A | 6/1997 | Takasu et al. | | 438/30 |
| 5,652,600 A | 7/1997 | Khormaei et al. | | 345/76 |
| 5,677,744 A * | 10/1997 | Yoneda et al. | | 349/12 |
| 5,712,528 A | 1/1998 | Barrow et al. | | 313/506 |
| 5,751,453 A * | 5/1998 | Baur | | 349/12 |
| 5,757,522 A | 5/1998 | Kulick et al. | | 359/9 |
| 5,767,623 A | 6/1998 | Friedman et al. | | 313/509 |
| 5,778,108 A | 7/1998 | Coleman, Jr. | | 382/305 |
| 5,793,342 A | 8/1998 | Rhoads | | 345/76 |
| 5,812,109 A | 9/1998 | Kaifu et al. | | 345/104 |
| 5,818,553 A * | 10/1998 | Koenck et al. | | 349/61 |
| 5,838,290 A | 11/1998 | Kuijk | | 345/91 |
| 5,838,308 A * | 11/1998 | Knapp et al. | | 345/173 |
| 5,852,487 A | 12/1998 | Fujimori et al. | | 349/162 |
| 5,877,735 A | 3/1999 | King et al. | | 345/76 |
| 5,890,799 A | 4/1999 | Yiu et al. | | 712/322 |
| 5,917,464 A | 6/1999 | Stearns | | 345/87 |
| 5,920,360 A | 7/1999 | Coleman, Jr. | | 348/700 |
| 5,930,591 A | 7/1999 | Huang | | |
| 5,959,697 A | 9/1999 | Coleman, Jr. | | 348/700 |
| 5,962,856 A | 10/1999 | Zhao et al. | | |
| 5,990,980 A | 11/1999 | Golin | | 348/700 |
| 5,990,988 A * | 11/1999 | Hanihara et al. | | 349/48 |
| 6,020,590 A | 2/2000 | Aggas et al. | | |
| 6,020,945 A | 2/2000 | Sawai et al. | | 349/119 |
| 6,023,307 A * | 2/2000 | Park | | 349/24 |
| 6,067,062 A | 5/2000 | Takasu et al. | | 345/87 |
| 6,069,393 A * | 5/2000 | Hatanaka et al. | | 257/434 |
| 6,087,599 A | 7/2000 | Knowles | | 178/18 |
| 6,133,906 A | 10/2000 | Geaghan | | 345/179 |
| 6,163,313 A | 12/2000 | Aroyan et al. | | 345/173 |
| 6,177,302 B1 | 1/2001 | Yamazaki et al. | | 438/158 |
| 6,181,394 B1 | 1/2001 | Sanelle et al. | | 349/96 |
| 6,184,863 B1 | 2/2001 | Sibert et al. | | 345/156 |
| 6,236,063 B1 | 5/2001 | Yamazaki et al. | | |
| 6,242,729 B1 * | 6/2001 | Izumi et al. | | 250/208.1 |
| 6,262,408 B1 * | 7/2001 | Izumi et al. | | 250/208.1 |
| 6,278,423 B1 | 8/2001 | Wald et al. | | 345/76 |
| 6,278,444 B1 | 8/2001 | Wilson et al. | | 345/173 |
| 6,295,113 B1 * | 9/2001 | Yang | | 349/179 |
| 6,327,376 B1 | 12/2001 | Harkins | | |
| 6,351,076 B1 | 2/2002 | Yoshida et al. | | 315/169.2 |
| 6,380,995 B1 * | 4/2002 | Kim | | 349/113 |
| 6,392,254 B1 | 5/2002 | Liu et al. | | |
| 6,465,824 B1 | 10/2002 | Kwasnick et al. | | |
| 6,603,867 B1 | 8/2003 | Sugino | | |
| 6,681,034 B1 | 1/2004 | Russo | | |
| 2001/0000676 A1 * | 5/2001 | Zhang et al. | | 349/12 |
| 2001/0046013 A1 * | 11/2001 | Noritake et al. | | 349/113 |
| 2001/0052597 A1 | 12/2001 | Young et al. | | |
| 2001/0055008 A1 | 12/2001 | Young et al. | | |
| 2002/0027164 A1 | 3/2002 | Mault et al. | | |
| 2002/0030768 A1 | 3/2002 | Wu | | 349/42 |
| 2002/0300581 | 3/2002 | Janiak et al. | | |
| 2002/0052192 A1 | 5/2002 | Yamazaki et al. | | |
| 2002/0071074 A1 | 6/2002 | Noritake et al. | | |
| 2002/0074549 A1 | 6/2002 | Park et al. | | |
| 2002/0126240 A1 * | 9/2002 | Seiki et al. | | 349/114 |
| 2003/0103030 A1 | 6/2003 | Wu | | |
| 2003/0156087 A1 | 8/2003 | den Boer et al. | | |
| 2003/0156230 A1 | 8/2003 | den Boer et al. | | |
| 2003/0179323 A1 | 9/2003 | Abileah et al. | | |
| 2003/0205662 A1 | 11/2003 | den Boer | | |
| 2004/0046900 A1 | 3/2004 | den Boer et al. | | |
| 2004/0113877 A1 | 6/2004 | Abileah et al. | | |

FOREIGN PATENT DOCUMENTS

| | | |
|---|---|---|
| DE | 197 20 925 A1 | 12/1997 |
| EP | 0 426 362 A2 | 5/1991 |
| EP | 0 426 362 A3 | 5/1991 |
| EP | 0 426 469 A2 | 5/1991 |
| EP | 0 426 469 A3 | 5/1991 |
| EP | 0 464 908 B1 | 1/1992 |
| EP | 0 488 455 B1 | 6/1992 |
| EP | 0 490 683 B1 | 6/1992 |
| EP | 0 491 436 B1 | 9/1992 |
| EP | 0 509 589 B1 | 10/1992 |
| EP | 0 545 709 B1 | 6/1993 |
| EP | 0 572 009 A1 | 12/1993 |
| EP | 0 572 182 B1 | 12/1993 |
| EP | 0 587 236 B1 | 3/1994 |
| EP | 0 601 837 B1 | 6/1994 |
| EP | 0 633 542 B1 | 1/1995 |
| EP | 0 770 971 A2 | 10/1995 |
| EP | 0 770 971 A3 | 10/1995 |
| EP | 0 366 913 B1 | 11/1995 |
| EP | 0 384 509 B1 | 5/1997 |
| EP | 0 618 527 B1 | 9/1999 |
| JP | 64-40004 | 2/1989 |
| JP | 1196620 | 8/1989 |
| JP | 2211421 | 8/1990 |
| JP | 5019233 | 1/1993 |
| JP | 5173707 | 7/1993 |

| JP | 9185457 | 12/1995 |
| JP | 8166849 | 6/1996 |
| JP | 91279 | 1/1997 |
| JP | 9231002 | 9/1997 |
| JP | 9274537 | 10/1997 |
| JP | 10027068 | 1/1998 |
| JP | 10040004 | 2/1998 |
| JP | 10133817 | 5/1998 |
| JP | 10133819 | 5/1998 |
| JP | 10186136 | 7/1998 |
| JP | 10198515 | 7/1998 |
| JP | 11110110 | 4/1999 |
| JP | 11242562 | 9/1999 |
| JP | 200002041 | 1/2000 |
| WO | WO 99/21160 | 4/1999 |

* cited by examiner

IMAGE SENSOR WITH PHOTOSENSITIVE THIN FILM TRANSISTORS

RELATED APPLICATIONS

This application is a continuation-in-part and claims the benefit under 35 U.S.C. § 120 of U.S. patent application Ser. No. 10/217,798, filed Aug. 12, 2002, and U.S. patent application Ser. No. 10/307,106, filed Nov. 27, 2002. In addition, this application claims the benefit under 35 U.S.C. § 19(e) of U.S. Provisional Patent Application No. 60/359,263, filed Feb. 20, 2002.

TECHNICAL FIELD

The present invention relates to image sensors and, more specifically, to flat panel image sensors employing photosensitive thin film transistors.

BACKGROUND OF THE INVENTION

Flat panel image sensors are commercially successful products that are able to effectively detect electromagnetic radiation in and near the visible light spectrum. Flat panel image sensors are fabricated by depositing and patterning various metals, insulators, and semiconductors on glass substrates as is done in flat panel displays. Such sensors commonly employ photosensitive elements, such as amorphous silicon (a-Si) PIN diodes. The photosensitive element is coupled to a readout switch, such as thin film transistor (TFT), that provides data indicative of received light.

A common use for flat panel image sensors is for medical and industrial applications to detect X-rays. The image sensor includes a phosphorescent screen that overlays an array of image sensing elements. The phosphorescent screen converts received X-rays to visible light. The array receives the visible light and generates a photocurrent responsive to the light. The photocurrent is read out as data indicative of the sensed light.

The arrays are difficult to manufacture since separate process steps are required to construct the PIN diodes and the TFTs. The total mask count may be 8 or more which is burdensome while the yields are low. Furthermore, a-Si PIN diodes are not a standard device in flat panel display processing which increases manufacturing expense. It would therefore be advantageous to use a standard process to greatly reduce the cost of flat panel image sensors.

Manufacturing TFTs for flat panel applications is a common process. A common use for TFTs is in active matrix liquid crystal displays (AMLCDs). Each TFT functions as a switch for a pixel in a matrix display. The voltage across each pixel is controlled independently and at a high contrast ratio. TFTs may be fabricated by depositing and patterning metals, insulators, and semiconductors on substrates through methods well known in the art. TFTs typically employ a-Si, polycrystalline silicon, or CdSe film as the semiconductor material. A-Si is typically used in flat panel applications as it is easily deposited on large area glass substrates at temperatures below 350 centigrade.

TFTs are more economical to fabricate than a-Si PIN diodes and are well suited for flat panel applications. The present inventors have recognized that if both the image sensing element and the readout switch of an image sensor array were incorporated as TFTs, fewer photomasks would be required and manufacturing costs would be greatly reduced.

TFTs have not commonly been used as photosensitive elements. U.S. patent application Publication Nos. 2001/0055008 and 2001/0052597, both to Young et al. (hereinafter the "Young applications"), disclose the use of TFTs as light sensing elements for a display device. The light sensing elements provide feedback to progressively adjust the current flow through display elements to control light output. However, the use of TFTs exclusively for an image sensor is not disclosed. Since a TFT is more economical to manufacture and has already been successfully incorporated into flat panel applications, the present inventors have recognized that it would be advantageous to employ TFTs in image sensors.

SUMMARY OF THE INVENTION

An image sensor array includes image sensors disposed on a substrate and arranged to receive and sense an image. Each image sensor represents a pixel for a received image. The image sensors each include a photo TFT that generates a photocurrent in response to the image. The photo TFT may be manufactured using common processes for TFTs in flat panel applications. The photo TFT has a gate electrode which is shorted to its source electrode to obtain a photocurrent that is substantially independent of source-drain bias. The photo TFT may also be configured with interdigitated source and drain electrodes to increase the photosensitivity.

Each photo TFT is coupled to a bias line to enable operation and a storage capacitor to store a charge and discharge upon generation of a photocurrent. The storage capacitor is coupled to a readout TFT that is also manufactured using known processes. The readout TFT passes a charge from the storage capacitor to a data line. Operation of the readout TFT is enabled by a select line which is coupled to the gate electrode of the readout TFT. A light shield may be disposed over the channel of the readout TFT to prevent a charge leaking through the readout TFT.

The photo TFTs can provide an effective and economical alternative to conventional photodiodes. Photo TFTs may be manufactured with corresponding readout TFTs using conventional methods thereby reducing mask counts and costs. Photo TFTs may further yield photocurrents greater than that of photodiodes.

Additional aspects and advantages of this invention will be apparent from the following detailed description of preferred embodiments thereof, which proceeds with reference to the accompanying drawings.

Additional aspects and advantages of this invention will be apparent from the following detailed description of preferred embodiments, which proceeds with reference to the accompanying drawings.

BRIEF DESCRIPTION OF THE DRAWINGS

Non-exhaustive embodiments of the invention are described with reference to the figures in which.

DETAILED DESCRIPTION OF PREFERRED EMBODIMENTS

Figure 1A:
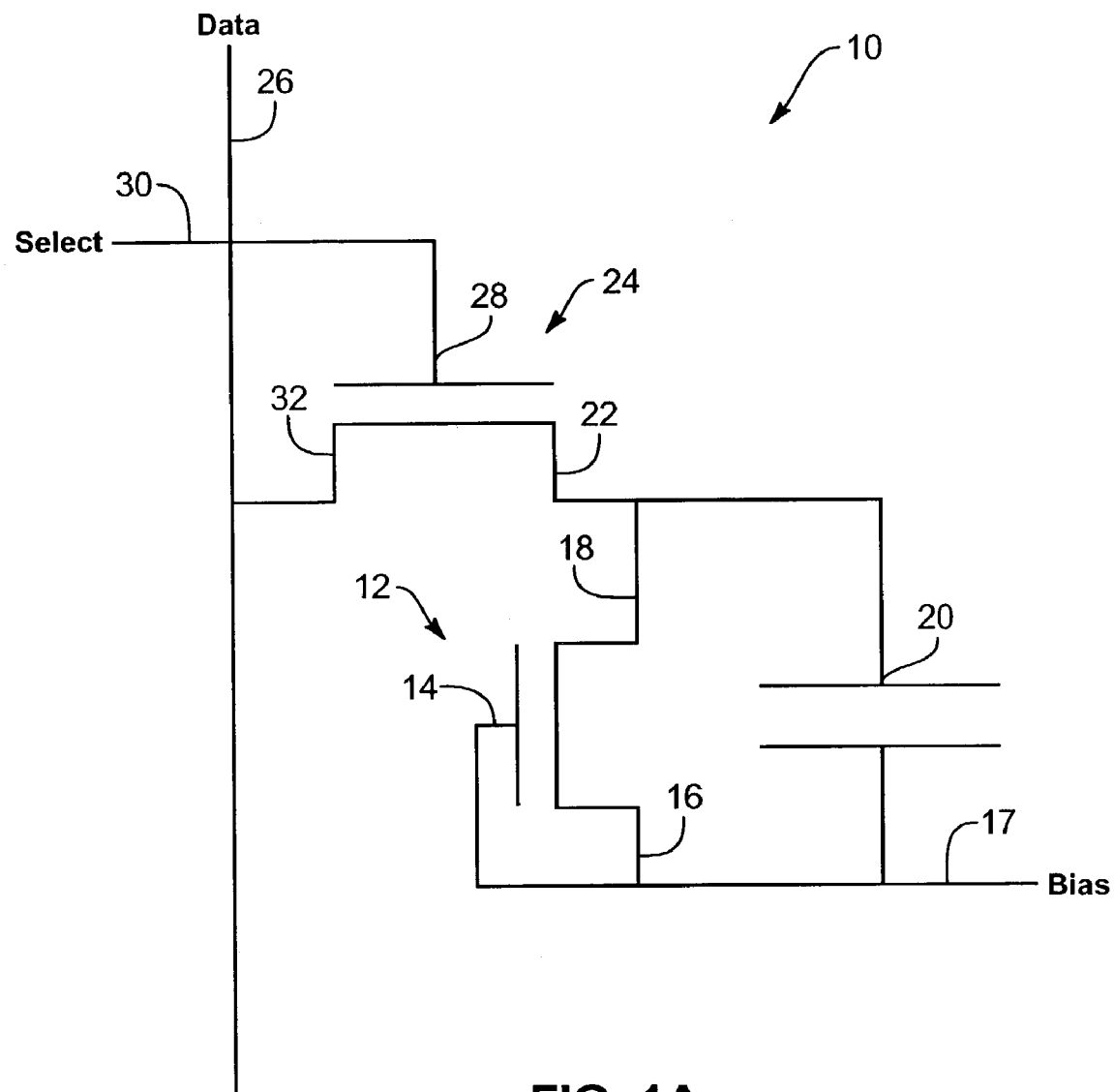
FIG. 1A is a schematic diagram of an embodiment of a sensor element.

Reference is now made to the figures in which like reference numerals refer to like elements. For clarity, the first digit or digits of a reference numeral indicates the figure number in which the corresponding element is first used.

Throughout the specification, reference to "one embodiment" or "an embodiment" means that a particular described feature, structure, or characteristic is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the invention.

Referring to FIG. 1A, an embodiment of a sensor element 10 is shown suitable for use in an image sensor matrix array. The sensor element 10 includes a photo TFT 12 that generates a photocurrent in response to received light. The photo TFT 12 is easily fabricated using common thin film layers. In the embodiment shown, the photo TFT 12 is a gated device having similarly doped contact regions and an intrinsic semiconductor region disposed between. The photo TFT 12 has a gate electrode 14 that is coupled directly to the source electrode 16. The coupling of the gate and source electrodes 14, 16 creates a generated photocurrent that, for short channel lengths, exceeds that of an a-Si PIN photodiode. The photocurrent is a secondary photocurrent and has a potential gain of more than one whereas an a-Si PIN photodiode typically has a gain of less than one. The source electrode 16 is coupled to a bias line 17 which is common to all photosensitive elements in an array. In operation, the bias line 17 may be coupled to a negative voltage.

The source and drain electrodes 16, 18 of the photo TFT 12 are coupled to a storage capacitor 20 which is discharged when the photo TFT 12 is exposed to light. The storage capacitor 20 is coupled to the source electrode 22 of a readout TFT 24. The charge on the storage capacitor 20 is read out periodically through the readout TFT 24 and a data line 26. As shown, the gate electrode 28 of the readout TFT 24 is coupled to a select line 30 to enable the readout TFT 24. A drain electrode 32 is coupled to the data line 26 to readout a charge.

The photo TFT 12 and the readout TFT 24 may be manufactured using common TFT manufacturing methods, such as in AMLCD applications. The TFTs 12, 24 generally include substantially co-planar source and drain electrodes, a semiconductor layer between the source and drain electrodes, and a gate electrode in proximity to the semiconductor layer but electrically insulated by a gate insulator. Current flow between the source and drain electrodes is controlled by the application of a voltage to the gate electrode. The voltage to the gate electrode produces an electric field which accumulates a charged region near the semiconductor-gate insulator interface. This charged region forms a current conducting channel in the semiconductor layer through which the device current is conducted.

Figure 1B:
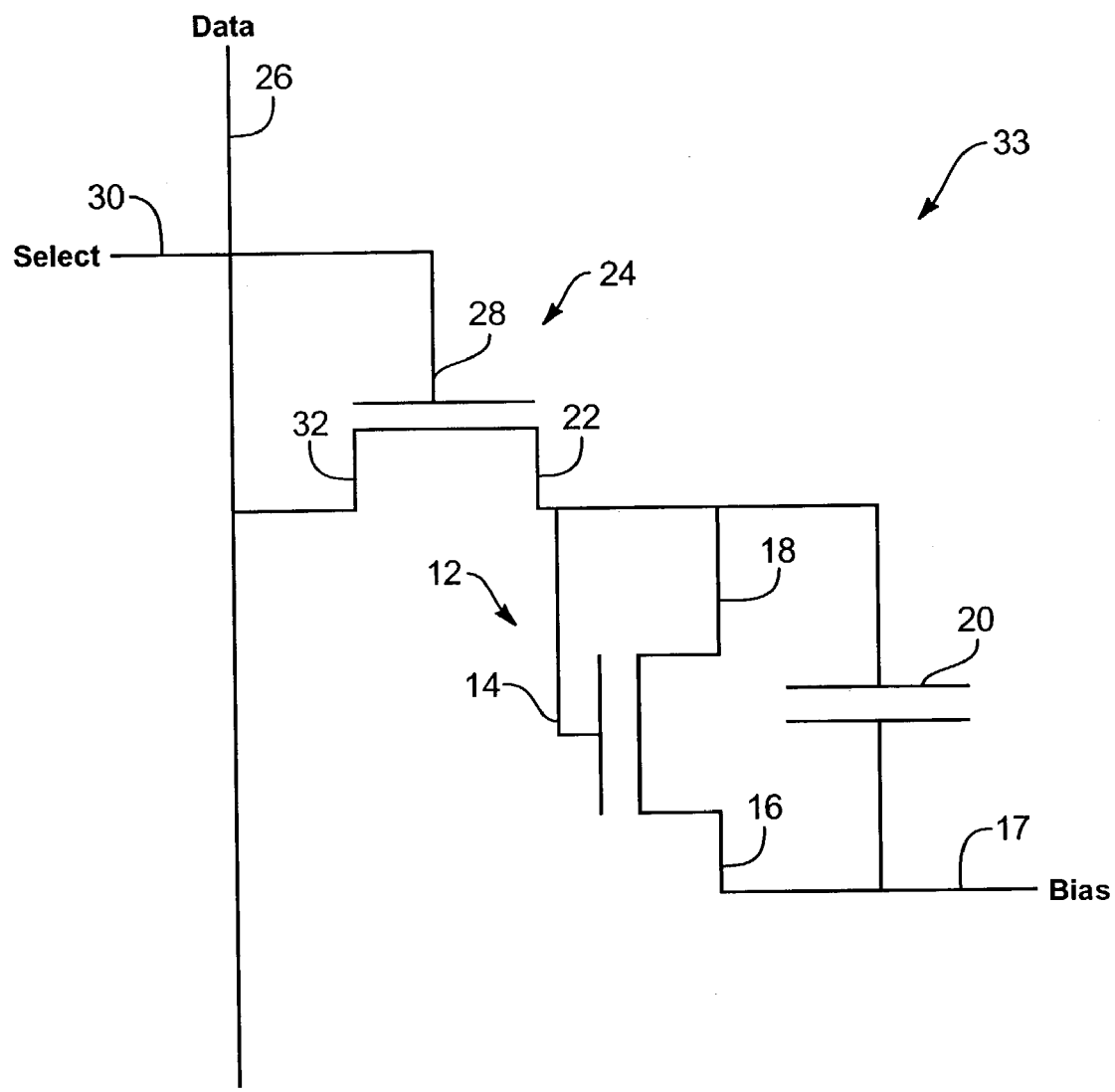
FIG. 1B is a schematic diagram of an alternative embodiment of a sensor element.

Referring to FIG. 1B an alternative embodiment of a sensor element 33 is shown. The sensor element 33 differs from the previously shown embodiment in that the gate electrode 14 is coupled directly to the drain electrode 18. In operation, the bias line 17 has a positive voltage bias. Operation of the sensor element 33 is similar to that of sensor element 10. The storage capacitor 20 is discharged when the photo TFT 12 is exposed to light. The charge on the storage capacitor 20 is read out periodically through the readout TFT 24 and the data line 26.

Figure 2:
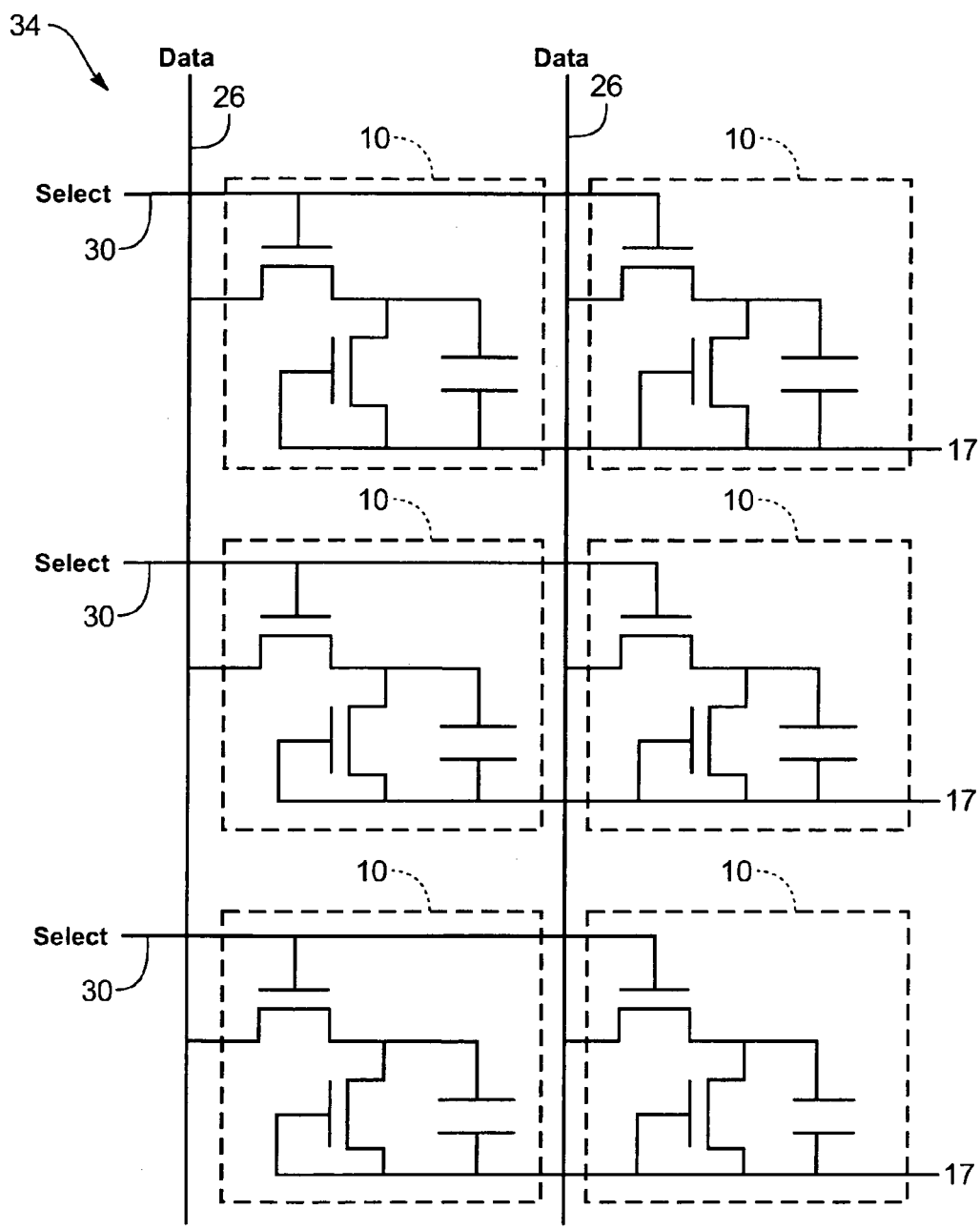
FIG. 2 is a schematic diagram of an array of sensor elements.

Referring to FIG. 2, a schematic is shown of an image sensor array 34 that includes regularly-spaced sensor elements 10 of FIG. 1A. Although elements 10 of FIG. 1A are shown, sensor elements of FIG. 1B may be used as well. The sensor elements 10 are arranged at intersections between rows and columns with each element corresponding to an individual pixel. The rows are designated by the select lines 30 and the columns are designated by the data lines 26. Individual sensor elements respond to received light and generate a data signal that is transmitted on an associated data line 26. As data signals pass through the data lines 26 to a control circuit, an image sensor array 34 determines the location of a received image on the array 34.

The array 34 is for illustrative purposes only as an image sensor would have far more sensor elements. The select lines 30 may be in communication with an address circuit to address individual readout TFTs.

Figure 3:
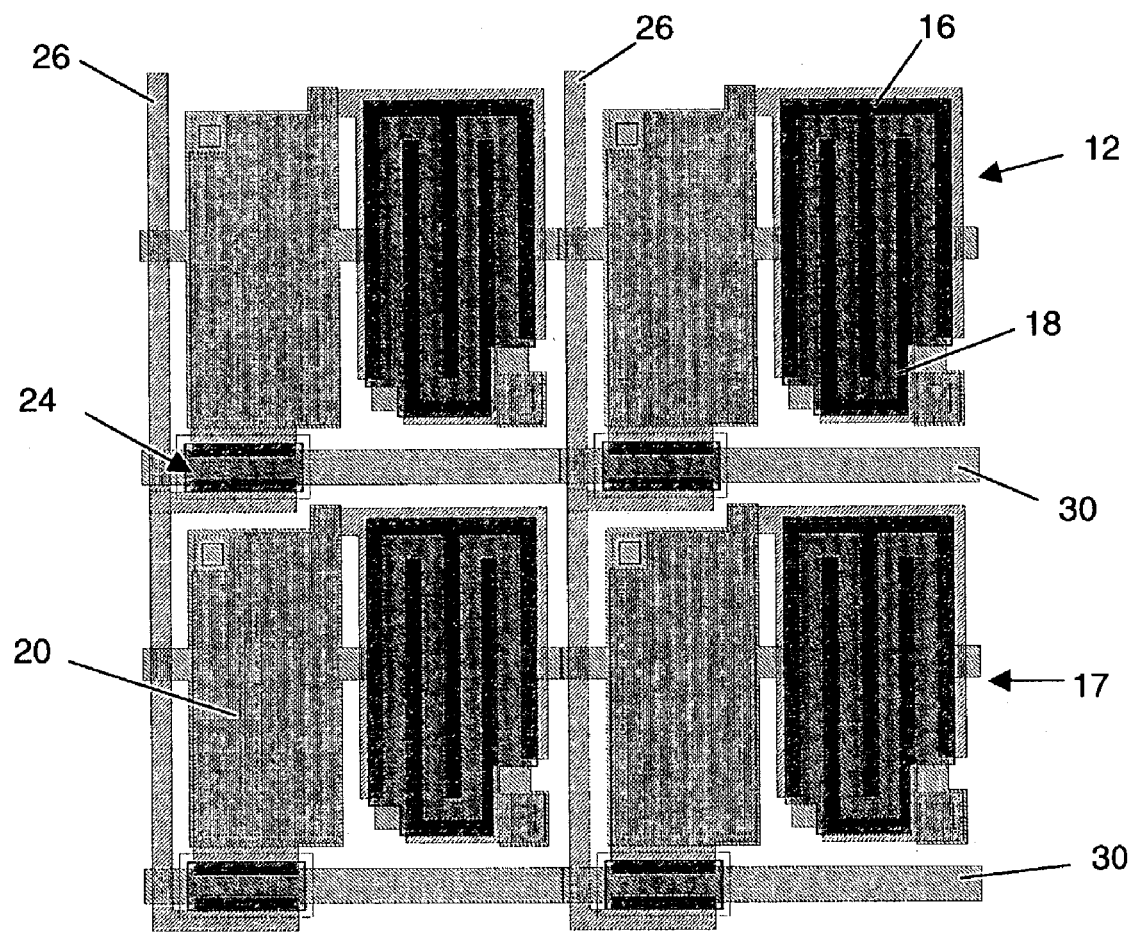
FIG. 3 is a plan view of an embodiment of sensor elements for use in an image sensor array.

Referring to FIG. 3, a plan view of four sensor elements 10 is shown. The photo and readout TFTs 12, 24 may be embodied as various structures which may be manufactured using processes similar to that for TFTs in an AMLCD. The plan view provides a view of components relative to one another. As shown, the photo TFT 12 has a source electrode 16 and drain electrode 18 configured with extending members. The extending members are disposed relative to one another to form an interdigitated pattern.

Figure 4:
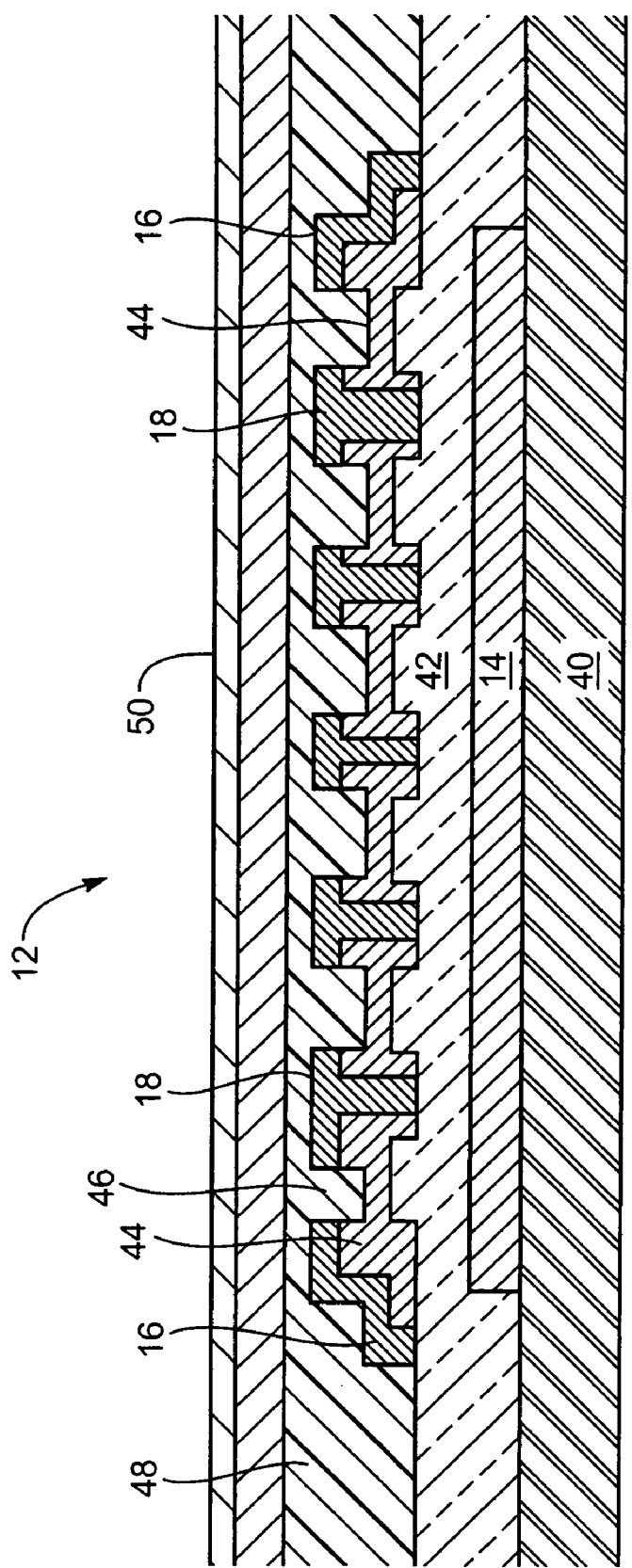
FIG. 4 is a cross-sectional view of one embodiment of a photo TFT.

Referring to FIG. 4, a cross-sectional view of one embodiment of a photo TFT 12 of FIG. 3 is shown. The photo TFT 12 may be used in either sensor elements 10, 33 of FIG. 1A or 1B. The photo TFT 12 includes a gate electrode 14 deposited and patterned on an insulating transparent substrate 40, such as glass, quartz, sapphire, or the like. The gate electrode 14 may include metals such as Cr, Cu, Al, Ta, Ti or the like. A gate insulator 42 insulates the gate electrode 14 from a semiconductor layer 44. The gate insulator 42 may include various materials well known in the art, such as silicon nitride, silicon oxide, or the like.

A semiconductor layer 44 is stacked on the gate insulator 42 above the gate electrode 14 and may include a-Si, p-Si, amorphous silicon carbide (SiC), tellurium (Te), selenium (Se), cadmium sulfide (CdS), cadmium selenide (CdSe), or the like. However, a-Si is well suited to large area fabrication on glass substrates at temperatures below 350 centigrade and exhibits a very high, dark resistivity. The semiconductor layer 44 may be deposited in accordance with methods known in the art including sputtering or deposition, such as plasma-enhanced chemical vapor deposition. The semiconductor layer 44 may be patterned through known methods, such as by use of a mask and photolithographic processing.

The semiconductor layer 44 may include an n+ layer that contacts the source and drain electrodes 16, 18. The n+ layer may be deposited on opposing ends of the semiconductor layer 44 where contact exists with the source and drain electrodes 16, 18. The n+ layer provides a low resistance contact for the source and drain electrodes 16, 18, and suppresses hole injection at negative gate voltage.

The source and drain electrodes 16, 18 are patterned at a certain distance from one another so that the electrodes 16, 18 are separated by a co-planar region of semiconductor material 44 in order to form a gate controlled current channel. The semiconductor layer 44 may be configured as shown in FIG. 4, to provide contact between alternating source and drain electrode extending members 16, 18. As such, the semiconductor layer 44 and source and drain electrode extending members 16, 18 are patterned and etched to form multiple channels 46. The interdigitated pattern increases the photosensitivity of the photo TFT 12, although one of skill in the art will appreciate that the photo TFT 12 may have an alternative configuration such as a simple inverted staggered structure, trilayer type inverted staggered structure, or other known structures.

In one embodiment, a passivation layer 48 is formed on an upper surface of the photo TFT 12 to cover and protect the channels 46. The passivation layer 48 may include silicon nitride, silicon oxide, and combinations thereof. The passivation layer 48 may extend and cover the electrodes 16, 18 as well.

The present invention has particular application in detecting x-ray emissions in the industrial and medical industries. The photo TFT 12 may be used to detect x-ray emissions by covering the TFT 12 with a screen 50 to convert x-rays to light. The screen 50 includes scintillator material that absorbs x-rays and converts the energy to visible light. Scintillator material may yield many light photons for each received x-ray photon. The scintillator material usually consists of a high-atomic number material, which has high x-ray absorption, and a low-concentration activator that provides direct band transitions to facilitate visible photon emission.

Acceptable scintillator materials include granular like phosphors or crystalline like cesium iodide (CsI). Phosphors glow when exposed to x-rays. Various grain sizes and chemical mixtures may be used to produce a variety of resolution and brightness varieties. CsI provides a better combination of resolution and brightness. Because cesium has a high atomic number, it is an excellent x-ray absorber and is very efficient at converting x-ray to visible light. The scintillator material may be mixed with a glue binder and coated onto plastic sheets to form the screen 50. In one embodiment the scintillator material includes relatively low cost external phosphor such as Kodak® LANEX, which has a $Gd_2O_2S$:Tb layer to convert X-rays to green light with a wavelength of 544 nm.

In operation, the dark current of the photo TFT 12 may be significant and create noise in an image. In order to compensate, the dark image may be stored in a memory and subtracted from the light image. The dark current may also exhibit some drift over time, which affects the gray scale accuracy and image quality. This may be minimized by periodically, e.g. every minute, interrupting the light exposure and retaking the dark reference image.

Figure 5:
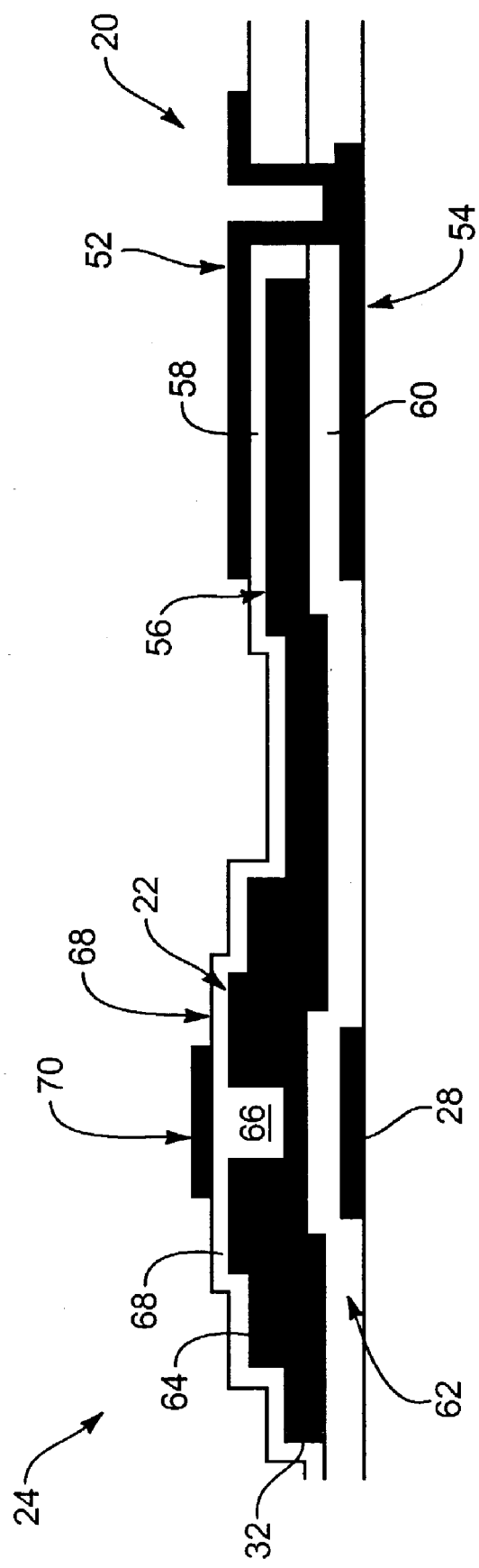
FIG. 5 is a cross-sectional view of one embodiment of a readout TFT and a storage capacitor.

Referring to FIG. 5, a cross-sectional view of an embodiment of a storage capacitor 20 and a readout TFT 24 coupled to one another is shown. The storage capacitor 20 may be embodied as a stacked capacitor having multiple layers and is deposited on a substrate 40. A stacked capacitor increases the dynamic range of the sensor element 10 and requires less space thereby increasing the space available for the photo TFT 12. In one embodiment, the capacitor 20 has a top electrode 52, bottom electrode 54, and a center electrode 56. The center electrode 56 is separated from the top and bottom electrodes 52, 54 by first and second dielectric layers 58, 60. The center electrode 56 may include Ni or a Ni alloy and, in the embodiment shown, couples to the source electrode 22 of the readout TFT 24.

The readout TFT 24 may have a conventional structure and a manufacturing process similar to that of a TFT in an array for an AMLCD. The TFT 24 includes a gate electrode 28 deposited on the upper surface of the insulating substrate 40. The gate electrode 28 may include Cu, Cr, Al, Ta, Ti, or combinations thereof and is deposited through known methods such as sputtering or vapor deposition. The gate electrode may then be patterned by photolithography or other known methods. A gate insulator 62 covers the gate electrode 28 and may include silicon nitride, silicon oxide, tantalum oxide, or combinations thereof. The gate insulator 62 may be the same layer that serves as a dielectric layer 60 for the storage capacitor 20.

A semiconductor layer 64 is deposited on the gate insulator 62 above the gate electrode 28 using known sputtering and deposition methods. The semiconductor layer 64 may include a-Si, p-Si, or the like and further include a doping layer, such as a n+ layer, that contacts the source and drain electrodes 22, 32. The source and drain electrodes 22, 32 are deposited and patterned using known methods and, with the semiconductor layer 64, form a channel 66.

A passivation layer 68, which may also be the same layer as passivation layer 48, covers and protects the channel 66. The passivation layer 68 may include silicon nitride, silicon oxide, or other suitable dielectric material and may also extend and serve as a dielectric layer 58 for the storage capacitor 20.

In one embodiment, which departs from conventional TFT structures, a light shield 70 may be disposed on the upper surface of the passivation layer 68 to cover the channel 66. The readout TFT 24 may be exposed to the same light level as the photo TFT 12. Shielding prevents a charge from leaking from the storage capacitor 20 through the readout TFT 24. The light shield 70 is opaque and may include Cr or other suitable material. In an alternative embodiment, the light shield 70 may also extend and serve as the top electrode 52 or as an additional electrode for the storage capacitor 20. An additional electrode increases the value of the storage capacitor 20.

Figure 6:
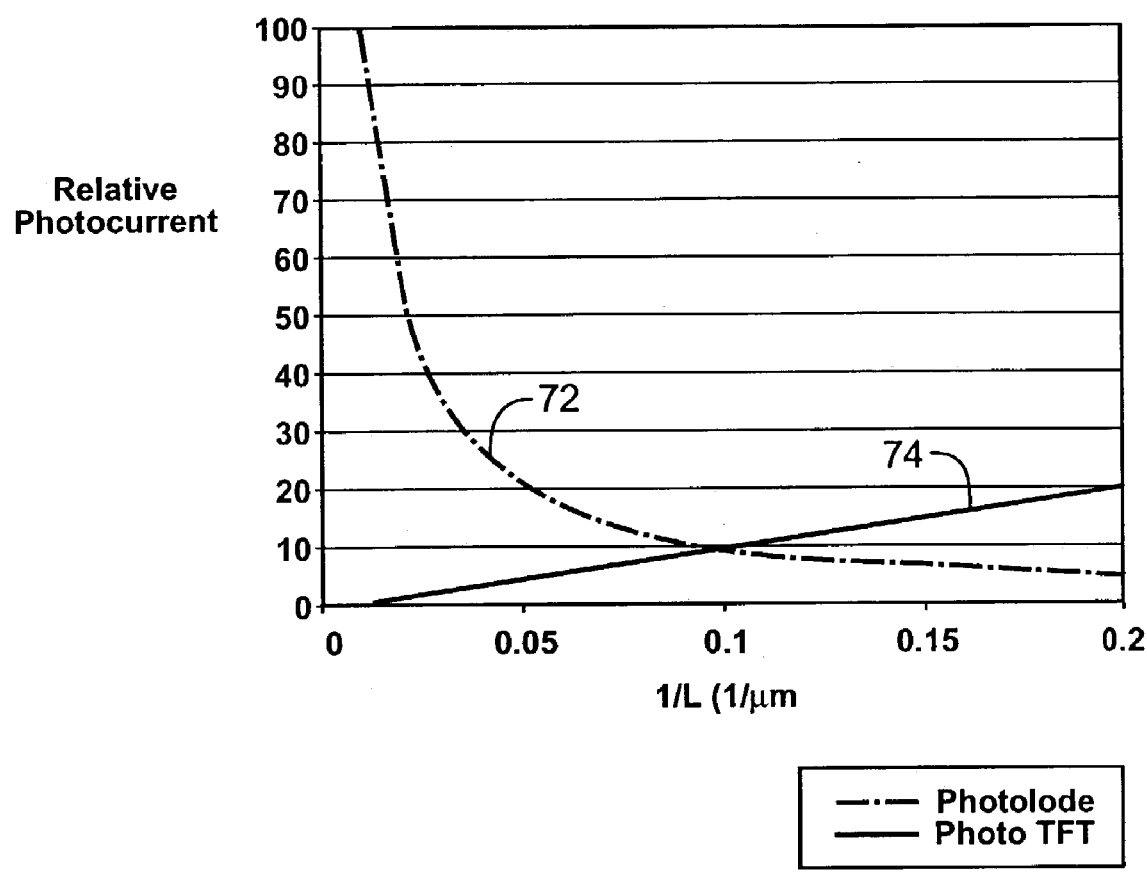
FIG. 6 is a graph comparing the photocurrent for a PIN photodiode with the photocurrent for a photo TFT.

Referring to FIG. 6, a graph is shown illustrating the relative photocurrents of an a-Si photodiode and an a-Si photo TFT as an inverse function of channel length (L). The photo TFT is configured with its gate electrode 14 coupled to its source electrode 16 as taught by the present invention. As illustrated, the resulting photocurrent of the photo TFT exceeds that of the photodiode for certain values of L. In the photodiode, the photocurrent 72 is proportional to the linear dimension L, whereas, in the photo TFT, the photocurrent 74 is proportional to 1/L.

At a certain value of L, which is approximately 10 to 20 µm, the conversion efficiency of photons into current becomes equal for the two devices. For smaller values of L, the photo TFT becomes more efficient. This is because the photocurrent 72 in the photo diode is a primary photocurrent with a gain that cannot exceed unity. One photon generates not more than one electron-hole pair, since the photo diode has blocking contacts for electrons and holes when reverse biased. Therefore, only one charge carrier can contribute to the photocurrent per absorbed photon. In the photo TFT, the source and drain contacts may be embodied as n+ layers so that electrons can be injected from the contacts and replenish the photocurrent. Thus, a secondary electron photocurrent occurs which can have a gain more than 1 when the electron lifetime exceeds the transit time from source to drain.

According to the present invention, there is provided an image sensor array having a substrate with addressable pixels. Each pixel defined by a sensor element 10 that has a photo TFT 12, storage capacitor 20, and a readout TFT. Each sensor element 10 is in electrical communication with a control circuit (not shown) to operate the sensor elements. The photo TFT 12 includes a doped semiconductor material that generates a current channel in response to received light and effectively discharges the storage capacitor 20.

TFT manufacturing for flat panel applications is a standard process which reduces the cost of the image sensor of the present invention. Whereas PIN diodes and TFTs require separate processes to manufacture and can require 8 or more photomasks, an image sensor of the present invention can be constructed with 3 to 5 photomasks. A photo TFT can yield photocurrents that exceed that of a PIN diode.

It will be obvious to those having skill in the art that many changes may be made to the details of the above-described embodiments of this invention without departing from the underlying principles thereof. The scope of the present invention should, therefore, be determined only by the following claims.

The invention is:

1. An image sensor for sensing received image, comprising:
    a substrate;
    a photo TFT disposed on the substrate to generate a photocurrent responsive to the received image, the photo TFT including,
        a gate electrode,
        a source electrode coupled to the gate electrode,
        a drain electrode, and
        a semiconductor layer coupled to the source and drain electrodes; and
    a storage capacitor disposed on the substrate and coupled to the source electrode and drain electrode of the photo TFT, the storage capacitor storing a charge generated by the photocurrent.

2. The image sensor of claim 1 wherein the storage capacitor comprises a stacked capacitor.

3. The image sensor of claim 1 wherein the semiconductor layer includes a n+ layer in contact with the source and drain electrodes.

4. The image sensor of claim 1 wherein the source electrode and the drain electrode of the photo TFT each include a plurality of extending members, the extending members of the source electrode interdigitated with the extending members of the drain electrode.

5. The image sensor of claim 1 wherein the semiconductor layer of the photo TFT includes amorphous silicon.

6. The image sensor of claim 1 wherein the photo TFT includes a gate insulator disposed between the respective gate electrode and semiconductor layer and preventing contact between the gate electrode and the semiconductor layer.

7. The image sensor of claim 1 wherein the gate electrode is selected from a group consisting of Cu, Cr, Al, Ta, and Ti.

8. The image sensor of claim 1 further comprising a passivation layer disposed on the photo TFT.

9. The image sensor of claim 8 wherein the passivation layer is selected from the group consisting of silicon nitride, silicon oxide, and tantalum oxide.

10. The image sensor of claim 1 further comprising a screen disposed adjacent the photo TFT to convert received x-rays to visible light.

11. An image sensor for sensing a received image, comprising:
    a substrate;
    a photo TFT disposed on the substrate to generate a photocurrent responsive to the received image, the photo TFT including,
        a gate electrode,
        a source electrode coupled to the gate electrode,
        a drain electrode, and
        a semiconductor layer coupled to the source and drain electrodes;
    a storage capacitor disposed on the substrate and coupled to the source electrode and drain electrode of the photo TFT, the storage capacitor storing a charge generated by the photocurrent; and
    a readout TFT disposed on the substrate, including,
        a gate electrode coupled to a select line,
        a source electrode coupled to the drain electrode of the photo TFT,
        a drain electrode coupled to a data line, and
        a semiconductor layer coupled to the source and drain electrodes.

12. The image sensor of claim 11 wherein the storage capacitor comprises a stacked capacitor.

13. The image sensor of claim 12 wherein the storage capacitor includes a center electrode coupled to the source electrode of the readout TFT.

14. The image sensor of claim 11 wherein the semiconductor layer of the photo TFT includes a n+ layer in contact with the source and drain electrodes.

15. The image sensor of claim 11 wherein the source electrode and the drain electrode of the photo TFT each include a plurality of extending members, the extending members of the source electrode interdigitated with the extending members of the drain electrode.

16. The image sensor of claim 11 wherein the semiconductor layer of the photo TFT includes amorphous silicon.

17. The image sensor of claim 11 wherein the photo TFT and the readout TFT each include a gate insulator disposed between the respective gate electrode and semiconductor layer and preventing contact between the gate electrode and the semiconductor layer.

18. The image sensor of claim 11 wherein the gate electrode is selected from a group consisting of Cu, Cr, Al, Ta, and Ti.

19. The image sensor of claim 11 further comprising a passivation layer disposed on the photo TFT and the readout TFT.

20. The image sensor of claim 19 wherein the passivation layer is selected from the group consisting of silicon nitride, silicon oxide, and tantalum oxide.

21. The image sensor of claim 19 further comprising a light shield disposed on the passivation layer substantially above the readout TFT.

22. The image sensor of claim 11 further comprising a screen disposed adjacent the photo TFT to convert received x-rays to visible light.

* * * * *

UNITED STATES PATENT AND TRADEMARK OFFICE
CERTIFICATE OF CORRECTION

PATENT NO. : 7,023,503 B2  Page 1 of 1
APPLICATION NO. : 10/347149
DATED : April 4, 2006
INVENTOR(S) : Willem den Boer It is certified that error appears in the above-identified patent and that said Letters Patent is hereby corrected as shown below:

Column 1, lines 33 and 36 "...X-rays..." change to -- x-rays --.

Column 5, line 48, "...X-rays..." change to -- x-rays --.

Signed and Sealed this

Twenty-sixth Day of December, 2006

JON W. DUDAS
*Director of the United States Patent and Trademark Office*